United States Patent
Ma et al.

(10) Patent No.: US 9,825,243 B2
(45) Date of Patent: Nov. 21, 2017

(54) METHODS FOR FABRICATING OLEDS ON NON-UNIFORM SUBSTRATES AND DEVICES MADE THEREFROM

(71) Applicant: Universal Display Corporation, Ewing, NJ (US)

(72) Inventors: Ruiqing Ma, Ewing, NJ (US); Zhaoqun Zhou, Ewing, NJ (US); Kamala Rajan, Ewing, NJ (US)

(73) Assignee: UDC Ireland Limited, Dublin (IE)

( * ) Notice: Subject to any disclaimer, the term of this patent is extended or adjusted under 35 U.S.C. 154(b) by 0 days.

(21) Appl. No.: 14/825,890

(22) Filed: Aug. 13, 2015

(65) Prior Publication Data
US 2016/0049617 A1 Feb. 18, 2016

Related U.S. Application Data

(60) Provisional application No. 62/038,473, filed on Aug. 18, 2014.

(51) Int. Cl.
*H01L 51/00* (2006.01)
*H01L 51/52* (2006.01)

(52) U.S. Cl.
CPC ...... *H01L 51/0097* (2013.01); *H01L 51/0023* (2013.01); *H01L 51/5206* (2013.01); *H01L 51/5221* (2013.01); *H01L 51/5275* (2013.01); *H01L 2251/5353* (2013.01); *Y02E 10/549* (2013.01)

(58) Field of Classification Search
CPC ............ H01L 51/0023; H01L 51/0097; H01L 51/5206; H01L 51/5221; H01L 51/5275; H01L 51/0096; H01L 51/5271
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |

(Continued)

FOREIGN PATENT DOCUMENTS

| | | |
|---|---|---|
| EP | 1238981 | 9/2002 |
| JP | 2010/135467 | 6/2010 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Christine Enad
(74) *Attorney, Agent, or Firm* — Riverside Law LLP

(57) ABSTRACT

Described herein are devices and methods related to fabrication of organic electroluminescent devices and related components. In certain embodiments, devices and methods for fabricating OLED panels on substrates with non-uniform reflection or un-even surfaces require that the non-uniform features are arranged in a way such that they are not presented in the region where photolithography features are needed. In certain embodiments, where precision processing such as photolithography features are needed, the substrate is designed to be flat.

20 Claims, 9 Drawing Sheets

(56) References Cited

U.S. PATENT DOCUMENTS

| | | | |
|---|---|---|---|
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 7,431,968 | B1 | 10/2008 | Shtein et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2006/0154393 | A1* | 7/2006 | Doan ................. H01L 33/0079 438/26 |
| 2010/0283036 | A1* | 11/2010 | Coe-Sullivan ....... H05B 33/145 257/13 |
| 2010/0328283 | A1* | 12/2010 | Lee ........................ G01J 1/04 345/207 |
| 2012/0119210 | A1* | 5/2012 | Lin ..................... H01L 27/1214 257/57 |
| 2012/0181933 | A1 | 7/2012 | Ma et al. |
| 2013/0026452 | A1 | 1/2013 | Kottas et al. |
| 2013/0119354 | A1 | 5/2013 | Ma et al. |
| 2014/0361180 | A1* | 12/2014 | Fujimura .......... H01L 27/14612 250/366 |
| 2015/0083468 | A1* | 3/2015 | Domercq ............ H01L 51/5215 174/255 |
| 2015/0090960 | A1 | 4/2015 | Ma et al. |

FOREIGN PATENT DOCUMENTS

| | | |
|---|---|---|
| WO | 2004/111066 | 12/2004 |
| WO | 2008/044723 | 4/2008 |
| WO | 2008057394 | 5/2008 |
| WO | 2010011390 | 1/2010 |
| WO | 2010/111175 | 9/2010 |

OTHER PUBLICATIONS

Baldo et al., "Very high-efficiency green organic light-emitting devices based on electrophosphorescence," Appl. Phys. Lett., vol. 75, No. 1, 4-6 (1999).

* cited by examiner

METHODS FOR FABRICATING OLEDS ON NON-UNIFORM SUBSTRATES AND DEVICES MADE THEREFROM

CROSS-REFERENCE TO RELATED APPLICATIONS

This application claims priority to U.S. Patent Application Ser. No. 62/038,473, filed Aug. 18, 2014, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to devices and methods for improving the fabrication process for organic light emitting diode (OLED) lighting devices, and improving the photolithography yield on a substrate with non-uniform optical reflection caused by uneven surfaces.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, 5,707,745, and 7,279,704, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

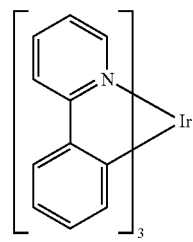

This figure depicts the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than"

or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Photolithography is generally needed and utilized for fabrication of OLED panels. For example, in an OLED display device, each pixel is defined by patterning individual electrodes (e.g. Indium Tin Oxide or ITO). Other features that need to be defined and fabricated may include thin film transistors (which can include multiple patterned materials such as metal, dielectric and semiconductors), buslines, and insulating material that cover the edge of patterned electrodes. In U.S. Patent Publication No. 2012/0181933, OLED lighting devices are disclosed that include fuses to be patterned in addition to other features. The dominant method to pattern these features is photolithography. For example, when patterning ITO, a blanket layer of ITO is deposited first, followed by a photoresist (PR) layer. This PR layer is then covered with a mask and put through UV exposure. After the exposure, the samples are put in a stripper. Certain types of PR material can easily be removed by a stripper after the UV exposure. After the stripper is applied, the PR coating has a pattern that corresponds to the mask. The sample can then be placed in a chemical to etch away the ITO where it is not protected by PR coating. In this photolithography process, the UV exposure of PR material is a critical process parameter that needs to be accurately controlled.

In almost all conventional photolithography processes, the substrate is flat and smooth. This provides a good condition for UV exposure. However, in some cases, an uneven surface exists. One example is provided in U.S. Patent Publication No. 2015/0090960, where a polymer coating is applied on a mold with an uneven surface. The polymer coating serves as the substrate for OLEDs to be built upon. The side next to the mold forms microlens protrusions for better light extraction. When multiple microlens are used in a pattern, they form a microlens array (MLA). With reference now to the prior art example shown in FIG. 3, the top surface of the substrate 312 is used for building OLEDs, so patterning needs to be performed on this surface 312. If a reflective mold (Si wafer) 310 with an uneven surface is used, the light will be reflected in different directions, causing non-uniform light intensity. This will disrupt the process condition and will result in lower yield, or even failed patterning. In addition, the top substrate surface 312 itself maybe uneven, which can also disrupt the process.

Thus, there is a need in the art for devices and methods for improving the fabrication of OLED lighting devices by improving the photolithography yield on a substrate with non-uniform optical reflection caused by uneven surfaces. Described herein are devices and methods that address this unmet need.

SUMMARY

A method for fabricating a pixel electrode component of an organic electroluminescent device is described. The method includes the steps of modifying a first surface of a substrate to form one or more optically uneven regions while leaving at least one region of the first surface substantially flat, and patterning an electrode on at least a portion of a second surface of the substrate, wherein at least a portion of the electrode is patterned on a region of the second substrate surface that opposes the at least one substantially flat region of the first substrate surface. In one embodiment, the optically uneven region comprises a non-planar surface. In one embodiment, the method includes patterning at least one pixel circuit component on the second substrate surface. In one embodiment, the pixel circuit component includes a thin film transistor. In one embodiment, the pixel circuit component includes a capacitor. In one embodiment, the method includes patterning at least one busline on the second substrate surface. In one embodiment, the method includes patterning at least one fuse on a portion of the second substrate surface, wherein the fuse connects a busline to the electrode. In one embodiment, the method includes patterning insulating material on at least a portion of the electrode. In one embodiment, the one or more uneven regions formed include a microlens array (MLA). In one embodiment, the electrode is patterned via photolithography. In one embodiment, the patterning via photolithography includes the steps of depositing an electrode material layer on the substrate, depositing a photoresist layer on the electrode material layer, masking a portion of the photoresist layer, exposing the photoresist layer to ultraviolet (UV) radiation to cure at least a portion of the photoresist layer, wherein the cured portion of the photoresist later corresponds to an electrode pattern, removing the uncured portion of the photoresist layer, and removing the portion of the electrode material layer not corresponding to the electrode pattern. In one embodiment, the intensity of the UV radiation during exposure is more uniform over the flat regions of the substrate than the uneven regions of the substrate. In one embodiment, the electrode material layer includes transparent conductive oxide (TCO) or metals. In one embodiment, the portion of the electrode patterned on a region of the second substrate surface that opposes the at least one substantially flat region of the first substrate surface includes an edge of the electrode. In one embodiment, the substrate is modified via a mold process including a mold. In one embodiment, the method includes the step of patterning at least one pixel circuit component on the second substrate surface while the substrate is attached to the mold. In one embodiment, the substrate is flexible. In one embodiment, the method includes patterning a color filter material layer between the second substrate surface and the electrode.

A method for fabricating an organic electroluminescent device is also described. The method includes the steps of modifying a first surface of a substrate having an opposing second surface to form one or more non-uniform reflection regions while leaving at least one uniform reflection region, and patterning at least one electrode on at least a portion of the at least one uniform reflection region. In one embodiment, the method includes patterning at least one pixel circuit component on a portion of the at least one uniform reflection region. In one embodiment, the pixel circuit component comprises a thin film transistor. In one embodiment, the pixel circuit component comprises a capacitor. In one embodiment, the method includes patterning at least one busline on a portion of the at least one uniform reflection region. In one embodiment, the method includes patterning at least one fuse on a portion of the at least one uniform reflection region, wherein the fuse connects a busline to the electrode. In one embodiment, the method includes patterning insulating material on at least a portion of the electrode. In one embodiment, the one or more non-uniform reflection regions formed comprise a microlens array (MLA). In one embodiment, the electrode is patterned via photolithography. In one embodiment, the patterning via photolithography includes the steps of depositing an electrode material layer over the substrate, depositing a photoresist layer on the electrode material layer, masking a portion of the photoresist layer, exposing the photoresist layer to ultraviolet (UV) radiation to cure at least a portion of the photoresist layer, wherein the cured portion of the photoresist later corresponds to an electrode pattern, removing the uncured portion of the photoresist layer, and removing the portion of the electrode material layer not corresponding to the electrode pattern. In one embodiment, the intensity of the UV radiation during exposure is more uniform over the at least one uniform reflection region than the one or more non-uniform reflection regions. In one embodiment, the electrode material layer includes transparent conductive oxide (TCO) or metals. In one embodiment, an edge of the at least one electrode is patterned on the at least one uniform reflection region. In one embodiment, the substrate is modified via a mold process including a mold. In one embodiment, the method includes patterning at least one pixel circuit component on the second substrate surface while the substrate is attached to the mold. In one embodiment, the method includes patterning a color filter material layer between the second substrate surface and the electrode. In one embodiment, the method includes forming the first and second surfaces simultaneously.

Also described is an organic electroluminescent device including a substrate having a first surface and an opposing second surface, said substrate having at least one non-uniform reflection region and at least one uniform reflection region, and multiple pixel electrodes positioned on the second surface, wherein an edge portion of each pixel electrode is patterned over the at least one uniform reflection region. In one embodiment, the device includes multiple pixel circuit components patterned on the second surface. In one embodiment, the pixel circuit component includes a thin film transistor. In one embodiment, the pixel circuit component includes a capacitor. In one embodiment, the device includes one or more buslines patterned on the second surface. In one embodiment, the device includes one or more fuses patterned on the second surface, wherein the one or more fuses connect a busline to a pixel electrode. In one embodiment, at least a portion of each pixel electrode is covered by insulating material. In one embodiment, at least a portion of the non-uniform reflection region is opposite an optically uneven region on the first surface. In one embodiment, the optically uneven region is a microlens array (MLA). In one embodiment, each MLA is opposite a pixel electrode, and the perimeter of the MLA does not extend beyond the perimeter of the pixel electrode. In one embodiment, the substrate is flexible. In one embodiment, the flexible substrate is a polymer. In one embodiment, the device includes multiple color filters between the second substrate surface and the multiple pixel electrodes.

Also described is an organic electroluminescent device including a substrate having a first surface and an opposing second surface, the substrate having at lease one uneven surface region and at least one substantially flat surface region, and a plurality of pixel electrodes positioned on the second surface, where an edge portion of each pixel electrode is patterned over the at least one substantially flat surface region. In one embodiment, of pixel circuit components patterned on the second surface. In one embodiment, the pixel circuit component includes a thin film transistor. In one embodiment, the pixel circuit component includes a capacitor. In one embodiment, one or more buslines patterned on the second surface. In one embodiment, one or more fuses are patterned on the second surface, where the one or more fuses connect a busline to a pixel electrode. In one embodiment, at least a portion of each pixel electrode is covered by insulating material. In one embodiment, the uneven surface region includes a microlens array (MLA). In one embodiment, each MLA is opposite a pixel electrode, and the perimeter of the MLA does not extend beyond the perimeter of the pixel electrode. In one embodiment, the substrate is flexible. In one embodiment, the flexible substrate is a polymer. In one embodiment, the device includes multiple color filters between the second substrate surface and the plurality of pixel electrodes.

According to another embodiment, a first device comprising a first organic light emitting device is also provided. The first organic light emitting device can include an anode, a cathode, and an organic layer, disposed between the anode and the cathode. In one embodiment, the first organic light emitting device includes a substrate having a first surface and an opposing second surface, said substrate having multiple non-uniform reflection regions and multiple uniform reflection regions, and multiple pixel electrodes positioned on the second surface, wherein an edge portion of each pixel electrode is patterned over the at least one uniform reflection regions. The first device can be a consumer product, an organic light-emitting device, and/or a lighting panel.

DETAILED DESCRIPTION

Figure 1:
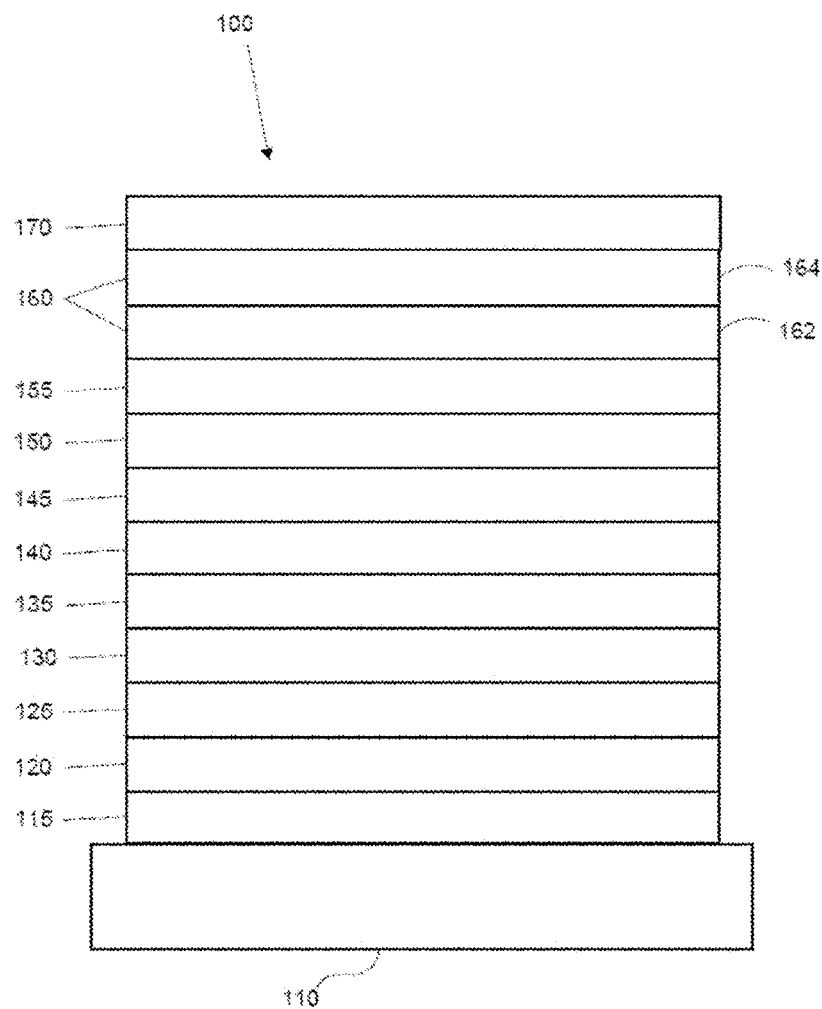
FIG. 1 shows an organic light emitting device.

Unless defined otherwise, all technical and scientific terms used herein have the same meaning as commonly understood by one of ordinary skill in the art to which this invention belongs. As used herein, each of the following terms has the meaning associated with it as described.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, or ±0.1% from the specified value, as such variations are appropriate.

"Flat" as used herein refers to a substantially planar surface.

"Uneven" as used herein refers to a non-planar surface.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
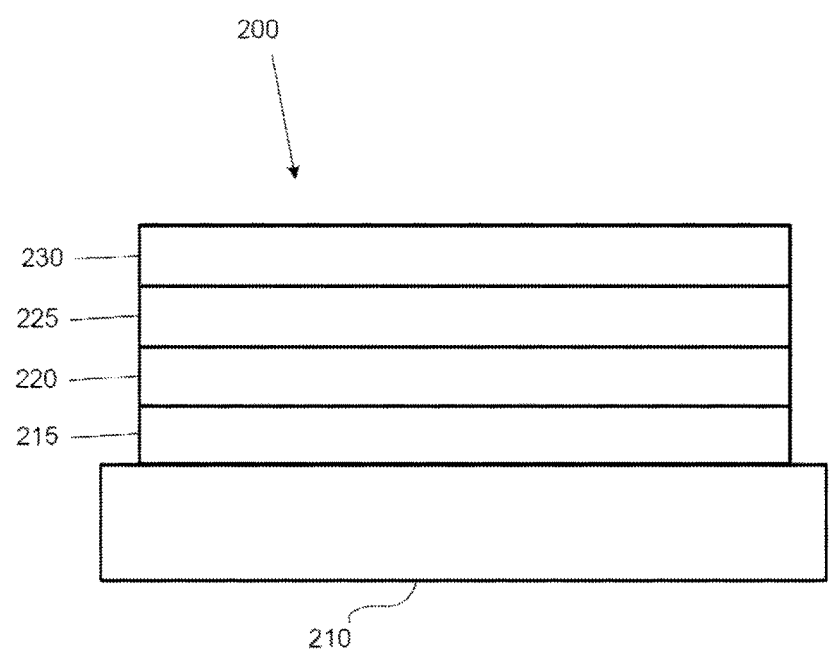
FIG. 2 shows an inverted organic light emitting device that does not have a separate electron transport layer.
Figure 3:
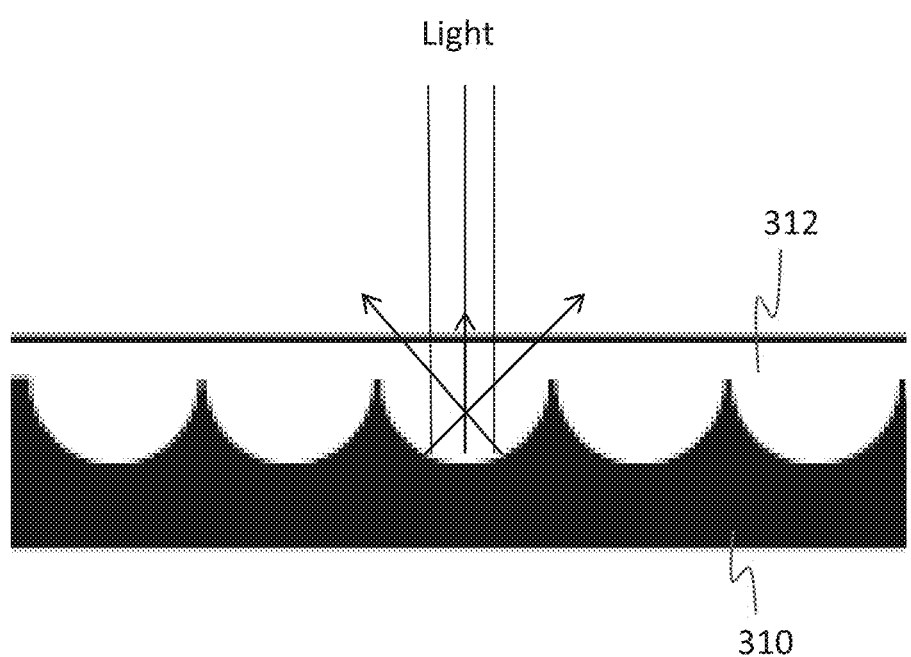
FIG. 3 is diagram illustrating disrupted light reflection from a non-even surface, which causes difficulties or failure of the photolithography process.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Methods disclosed herein for fabricating OLED panels on substrates with non-uniform reflection or un-even surfaces represent an improvement in the OLED fabrication processes. The non-uniform features may be arranged in a way such that they do not underlay regions also having photolithography features. Or in other words, where precision processing of photolithography features are needed, the substrate surfaces are designed to be flat. The OLED devices made by this method have the following properties according to certain embodiments: 1) the two top and bottom sides of the substrates have different surfaces, 2) the top surface is smooth and flat for device fabrication; 3) a region of the bottom surface is flat for facilitating precision processing and a region of bottom surface is filled with protrusions for light extraction; and 4) the material between the top and bottom surfaces can be the same material.

Figure 4:
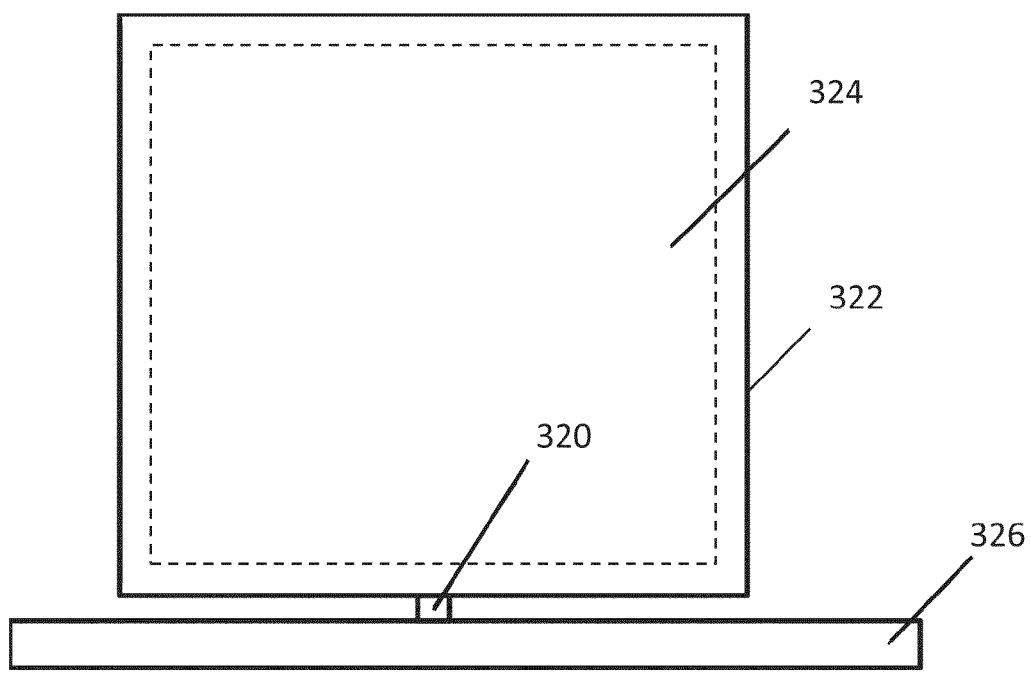
FIG. 4 is a diagram of a sub-pixel connected to buslines via a fuse, showing the solid lines that need to be defined by a photolithography process according to an exemplary embodiment.
Figure 5A:
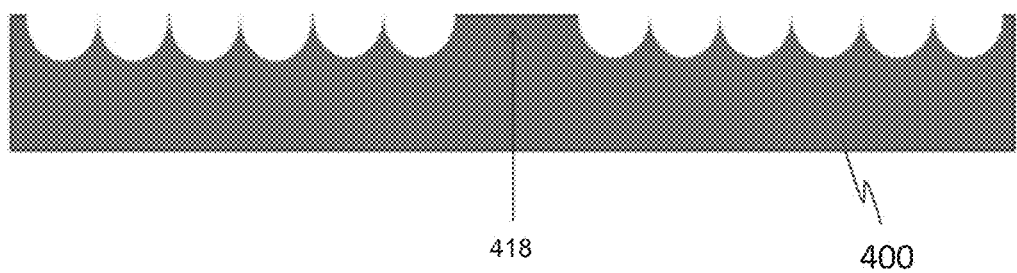
FIG. 5A is a cross-sectional view of an MLA mold according to an exemplary embodiment, in which flat area is applied to facilitate the fabrication and inspection of fuse and bus line during the photolithography. With precision alignment in the photolithography, the bus line and fuses are only patterned on the flat area of the mold.
Figure 5B:
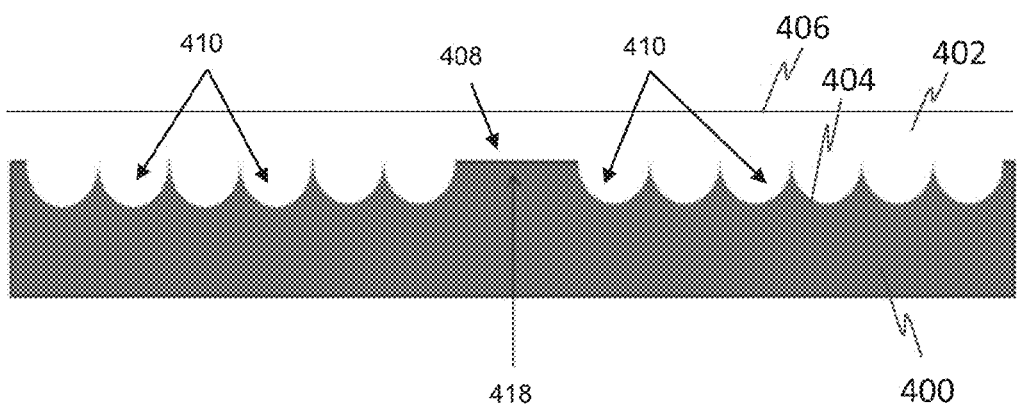
FIG. 5B is a cross-sectional view of an MLA mold with a substrate attached to the mold.

FIG. 4 shows a basic structure of one pixel electrode 322 connected to a busline 326 via a fuse 320 according to an exemplary embodiment. The pixel electrode 322 and fuse 320 use the same material (e.g. ITO), and the busline 326 is a metal in one embodiment. It should be appreciated that the methods described herein are not limited to the use of any particular materials, and therefore any materials suitable for pixel electrode 322 and fuse 320 construction may be used, as desired. Solid lines in FIG. 4 represent boundaries that need to be defined by a photolithography process. To make sure the photolithography process can be performed and completed accurately, all the non-even features (MLA) are placed within an area that does not overlap with any of those solid lines, as shown in the dashed line area 324 in FIG. 4. In certain embodiments, the uneven features are needed in active area (i.e. light emitting area). The ratio of the active area over all area can be defined as the fill factor. In certain embodiments, the fill factor can range from 10% to over 95%, depending on the application. The applications according to embodiments of the invention can include display and lighting applications. The area ratio of the uneven region to the flat region can track the fill factor in certain embodiments. In certain embodiments, photolithographic processing occurs on the surface region opposing the flat region only. A cross section of the mold is shown in FIGS. 5A and 5B, with regions of even surface for patterning features and regions of un-even surfaces for better light extraction. Pixels can be assembled into an array to construct a lighting device, such as that shown in FIG. 6.

With reference to the exemplary embodiment of FIGS. 5A and 5B, an organic electroluminescent device has a substrate 402 having a first surface 404 and an opposing second surface 406. Non-uniform reflection regions 410 and a uniform reflection region 408 are positioned throughout the substrate. Modifying the first surface 404 of the substrate 402 to form one or more optically uneven regions 410 while leaving at least one region 408 of the first surface 404 substantially flat makes it possible to pattern an electrode on at least a portion of the second surface of the substrate 406, so that at least a portion of the electrode is patterned over the flat region of the first substrate surface 404. In some embodiments, the patterning may overlay only the flat regions, while in other embodiments the patterning overlays both the flat region and the uneven region. In certain embodiments, less critical features such as metal bus lines overlay the uneven surfacing. At least one pixel circuit component may be patterned on the second substrate surface 406. The pixel circuit component may include one or more of, for example, a thin film transistor, a capacitor, a busline or a fuse. The fuse preferably connects the busline to the electrode. In certain embodiments, an insulating material is patterned on at least a portion of the electrode. In one embodiment, one or more uneven regions formed include a microlens array (MLA). The electrode is typically patterned via photolithography. While photolithography is a popular technique for patterning, it should be appreciated that other patterning techniques may take advantage of the embodiments disclosed herein.

Certain embodiments may include patterning via photolithography, further including the steps of depositing an electrode material layer on the substrate surface 406, depositing a photoresist layer on the electrode material layer, masking a portion of the photoresist layer, exposing the photoresist layer to ultraviolet (UV) radiation to cure at least a portion of the photoresist layer, where the cured portion of the photoresist later corresponds to an electrode pattern, removing the uncured portion of the photoresist layer, and removing the portion of the electrode material layer not corresponding to the electrode pattern. Preferably, the intensity of the UV radiation during exposure is more uniform over the flat regions of the substrate than the uneven regions of the substrate. In one embodiment, the electrode material layer includes transparent conductive oxide (TCO) or metals. In one embodiment, the portion of the electrode patterned on a region of the second substrate surface that opposes the at least one substantially flat region of the first substrate surface includes an edge of the electrode. In one embodiment, the substrate is modified via a mold process including a mold having a flat surface 418, such as the mold 400 in the exemplary embodiment of FIGS. 5A and 5B. At least one pixel circuit component on the second substrate surface 406 can be patterned while the substrate 402 is attached to the mold 400. In one embodiment, the method includes patterning a color filter material layer between the second substrate surface and the electrode.

The methods disclosed herein can be applied to a number of devices incorporating OLEDs, including both display and lighting panels. It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of ordinary skill in the art. It is understood that various theories as to why the invention works are not intended to be limiting.

EXPERIMENTAL EXAMPLE

Figure 6:
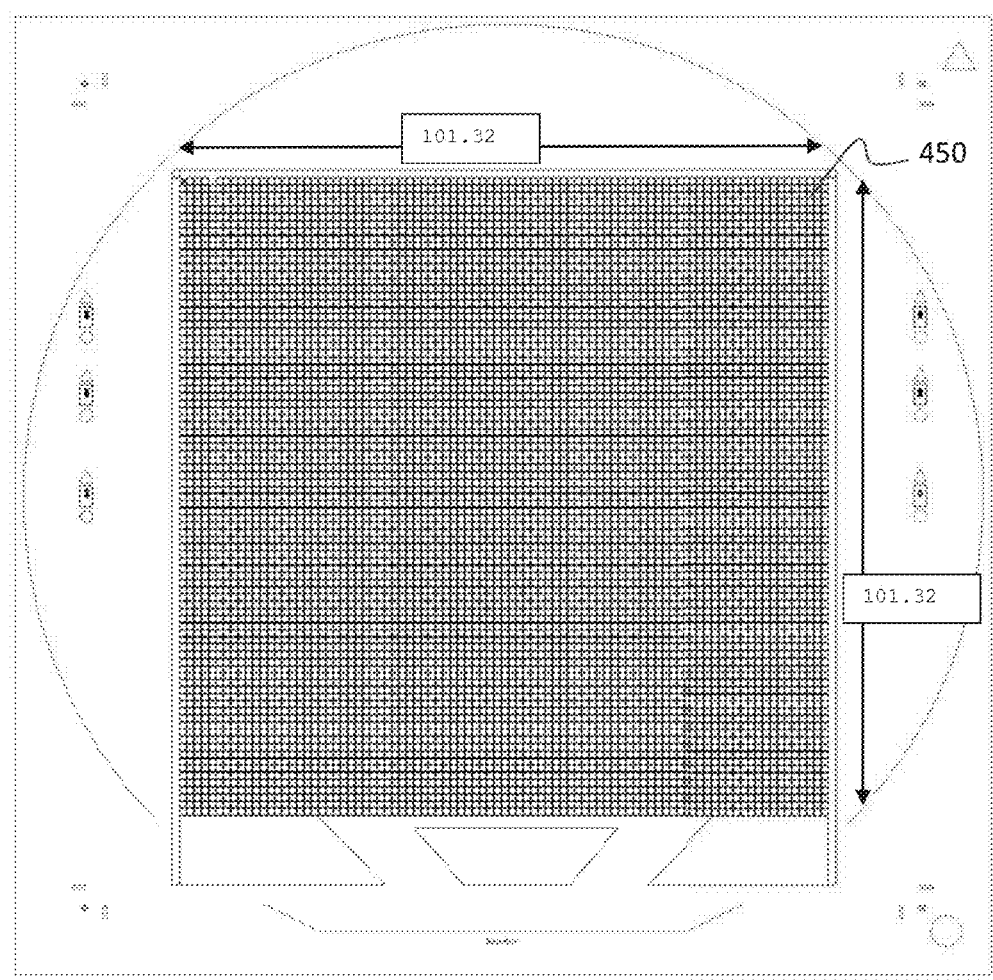
FIG. 6 is a diagram of a lighting panel with a bus line and fuse design according to an exemplary embodiment.
Figure 7:
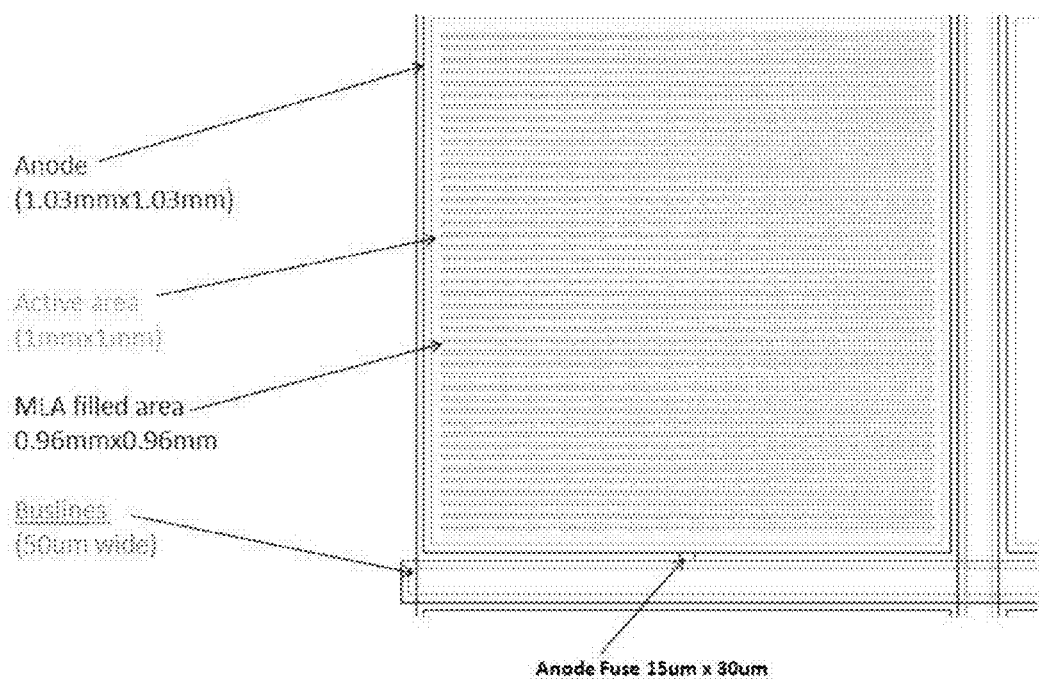
FIG. 7 is a diagram of a single sub-pixel with MLA pattern and flat bus line area according to an exemplary embodiment, in which the MLAs are strictly confined in the individual emitting area.

A lighting panel is designed and built using an embodiment of the method described above. FIG. 6 shows the layout of the overall panel. The active area of the panel 450 is approximately 101 mm×101 mm, and is further divided into 1 $mm^2$ sub-pixels. FIG. 7 shows the configuration of each sub-pixel.

Figure 8:
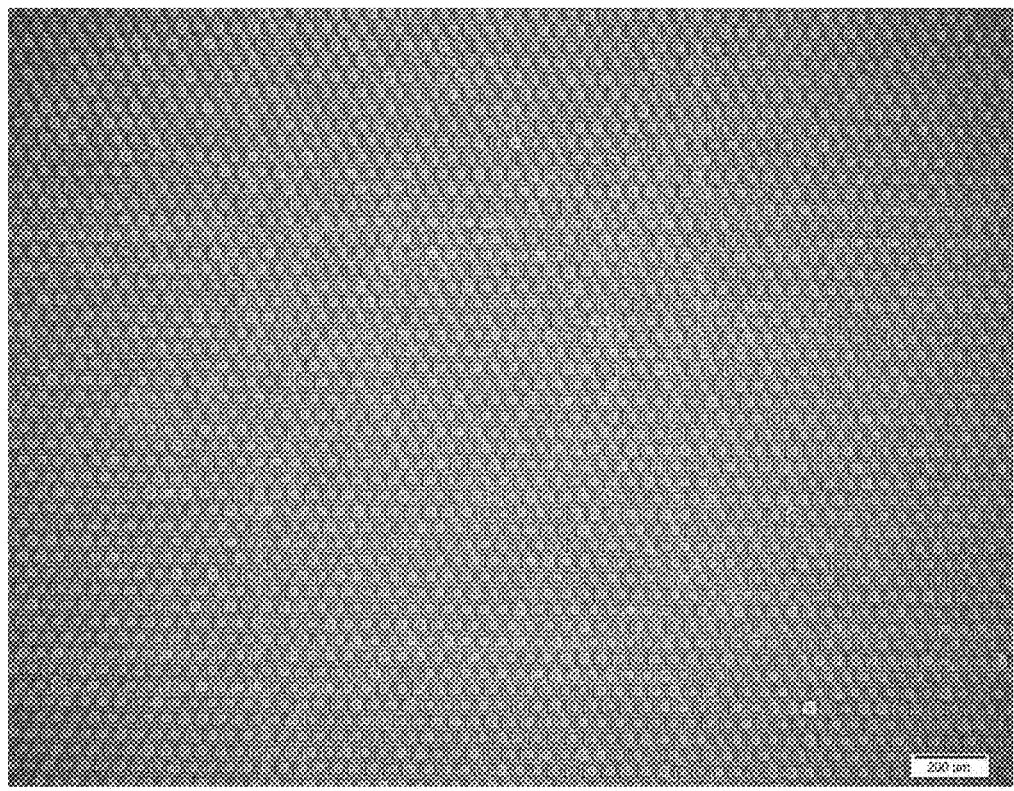
FIG. 8 is a prior art image of a typical pattern of the old process following an ITO etch process, illustrating that it is hard to inspect the pattern quality of bus line and fuse due to noisy background of MLAs.
Figure 9:
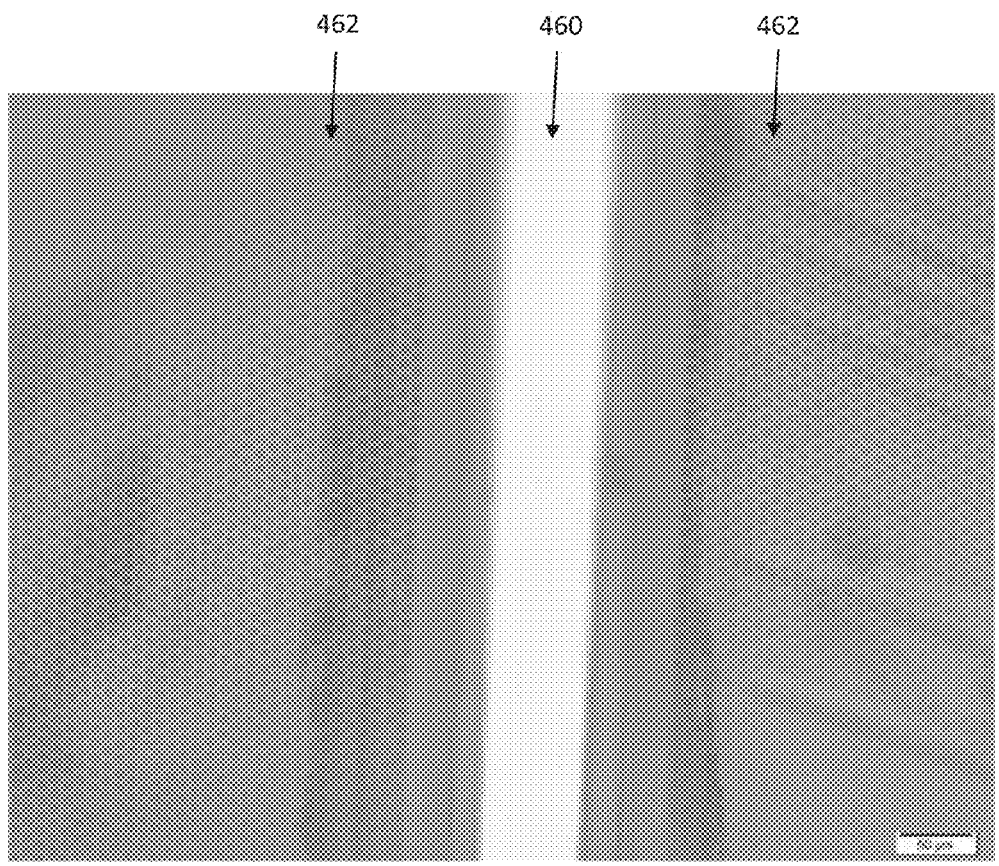
FIG. 9 is an image of a bus line and fuse pattern on a clear background according to the implementation of an exemplary embodiment of the method.

FIGS. 8 and 9 show comparative images of bus and fuse lines. FIG. 9 shows the bus line and fuse patterns on clear background after implementing the new method. For comparison, FIG. 8 shows the typical pattern of the old process after ITO etch process. As shown in FIG. 8, it was hard to inspect the pattern quality of bus line and fuse due to noisy background of MLAs. As shown in FIG. 9, noise is minimized and inspection is made easier when a flat region 460 is introduced among the uneven regions 462.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention.

The invention claimed is:

1. A method of fabricating a pixel electrode component of a display of an organic electroluminescent device, comprising:

modifying a first surface of a substrate in a display area of an organic electroluminescent device to form one or more optically uneven regions while leaving at least one region having an area of at least 50 microns by 50 microns of the first surface substantially flat, and patterning an electrode on at least a portion of a second surface of the substrate, wherein at least a portion of the electrode is patterned on a region of the second surface of the substrate that opposes the at least one substantially flat region of the first substrate surface.

2. The method of claim 1, wherein the optically uneven region comprises a non-planar surface.

3. The method of claim 1, further comprising patterning at least one pixel circuit component on the second surface of the substrate.

4. The method of claim 1, wherein the one or more uneven regions formed comprise a microlens array (MLA).

5. The method of claim 1, wherein the electrode is patterned via photolithography.

6. The method of claim 5, wherein the patterning via photolithography comprises:
   depositing an electrode material layer on the substrate,
   depositing a photoresist layer on the electrode material layer,
   masking a portion of the photoresist layer,
   exposing the photoresist layer to ultraviolet (UV) radiation to cure at least a portion of the photoresist layer, wherein the cured portion of the photoresist later corresponds to an electrode pattern,
   removing the uncured portion of the photoresist layer, and
   removing the portion of the electrode material layer not corresponding to the electrode pattern.

7. The method of claim 1, wherein the portion of the electrode patterned on a region of the second substrate surface that opposes the at least one substantially flat region of the first substrate surface includes an edge of the electrode.

8. The method of claim 1, further comprising patterning at least one pixel circuit component on the second substrate surface while the substrate is attached to a mold.

9. A method for fabricating an organic electroluminescent device, comprising:
   modifying a first surface of a substrate in a display area of an organic electroluminescent device having an opposing second surface to form one or more non-uniform reflection regions while leaving at least one uniform reflection region having an area of at least 50 microns by 50 microns, and
   patterning at least one electrode on at least a portion of the at least one uniform reflection region.

10. The method of claim 9, further comprising patterning at least one pixel circuit component on a portion of the at least one uniform reflection region.

11. The method of claim 9, wherein the one or more non-uniform reflection regions formed comprise a microlens array (MLA).

12. The method of claim 9, wherein the electrode is patterned via photolithography.

13. The method of claim 12, wherein the patterning via photolithography comprises:
   depositing an electrode material layer over the substrate,
   depositing a photoresist layer on the electrode material layer,
   masking a portion of the photoresist layer,
   exposing the photoresist layer to ultraviolet (UV) radiation to cure at least a portion of the photoresist layer, wherein the cured portion of the photoresist later corresponds to an electrode pattern,
   removing the uncured portion of the photoresist layer, and
   removing the portion of the electrode material layer not corresponding to the electrode pattern.

14. The method of claim 9, wherein an edge of the at least one electrode is patterned on the at least one uniform reflection region.

15. The method of claim 9, further comprising patterning at least one pixel circuit component on the second substrate surface while the substrate is attached to a mold.

16. An organic electroluminescent device comprising:
   a substrate having a first surface and an opposing second surface, said substrate having at least one non-uniform reflection regions in the display area of an organic electroluminescent device and at least one uniform reflection region having an area of at least 50 microns by 50 microns, and
   at least one pixel electrode positioned on the second surface,
   wherein an edge portion of the at least one pixel electrode is patterned over the at least one uniform reflection region.

17. The device of claim 16, further comprising a plurality of pixel circuit components patterned on the second surface.

18. The device of claim 16, wherein at least a portion of the non-uniform reflection region is opposite an optically uneven region on the first surface.

19. The device of claim 18, wherein the optically uneven region is a microlens array (MLA).

20. The device of claim 16, wherein the substrate is flexible.

* * * * *